United States Patent
Yang et al.

(10) Patent No.: US 10,999,667 B2
(45) Date of Patent: May 4, 2021

(54) EARBUD AND METHOD FOR IMPLEMENTING WEARING DETECTION AND TOUCH OPERATION

(71) Applicant: SHENZHEN GOODIX TECHNOLOGY CO., LTD., Shenzhen (CN)

(72) Inventors: Ming Yang, Shenzhen (CN); Shuqing Cheng, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/601,587

(22) Filed: Oct. 15, 2019

(65) Prior Publication Data

US 2020/0100010 A1 Mar. 26, 2020

Related U.S. Application Data

(63) Continuation of application No. PCT/CN2018/107390, filed on Sep. 25, 2018.

(51) Int. Cl.
*H04R 1/10* (2006.01)
*G06F 3/044* (2006.01)
*G06F 3/041* (2006.01)

(52) U.S. Cl.
CPC .............. *H04R 1/10* (2013.01); *G06F 3/044* (2013.01); *G06F 3/0416* (2013.01)

(58) Field of Classification Search
CPC ......... H04R 1/10; G06F 3/0416; G06F 3/044; H03K 17/962; H03K 2217/960755
See application file for complete search history.

(56) References Cited

U.S. PATENT DOCUMENTS

| 9,094,764 | B2* | 7/2015 | Rosener | H04R 19/00 |
| 9,998,817 | B1* | 6/2018 | Liu | H04R 1/1041 |
| 2009/0003641 | A1 | 1/2009 | van der Bilt | |
| 2017/0155998 | A1 | 6/2017 | Boesen | |
| 2019/0215611 | A1* | 7/2019 | Lou | G06F 1/163 |

(Continued)

FOREIGN PATENT DOCUMENTS

| CN | 201226587 A | 4/2009 |
| CN | 103002373 A | 3/2013 |
| CN | 104506987 A | 4/2015 |

(Continued)

*Primary Examiner* — Andrew L Sniezek
(74) *Attorney, Agent, or Firm* — Brion Raffoul

(57) ABSTRACT

The present application relates to the field of earbuds, and in particular, to an earbud and a method for implementing a wearing detection and a touch operation. The earbud includes at least two wearing sensors; each of the at least two wearing sensors comprises one or more capacitive sensing units, and a maximum detected capacitance value or a sum of detected capacitance values of the capacitive sensing units of each of the at least two wearing sensors is used as a maximum detection value of the wearing sensor; and the wearing sensors are arranged at different positions where a head of the earbud is in direct contact with skin tissues in the ear, and the earbud is determined to be in a worn state when the maximum detection value of each of the at least two wearing sensors is not smaller than a wearing threshold.

17 Claims, 4 Drawing Sheets

(56) References Cited

U.S. PATENT DOCUMENTS

2019/0297408 A1* 9/2019 Mohammadi ........ H03K 17/962
2020/0004943 A1* 1/2020 Gu ...................... H04L 63/0861

FOREIGN PATENT DOCUMENTS

| CN | 204468122 U | 7/2015 |
| CN | 106792308 A | 5/2017 |
| CN | 106994012 A | 8/2017 |
| CN | 107065016 A | 8/2017 |
| CN | 107801112 A | 3/2018 |
| CN | 108151657 A | 6/2018 |
| CN | 207560279 U | 6/2018 |

* cited by examiner

EARBUD AND METHOD FOR IMPLEMENTING WEARING DETECTION AND TOUCH OPERATION

CROSS-REFERENCE TO RELATED APPLICATIONS

The present application is a continuation of international application No. PCT/CN2018/107390, filed on Sep. 25, 2018, which is hereby incorporated by reference in its entireties.

TECHNICAL FIELD

The present application relates to the field of earbuds, and in particular, to an earbud and a method for implementing a wearing detection and a touch operation.

BACKGROUND

The earbud with wearing detection function can automatically recognize whether the user wears the earbud. When the earbud is taken off, it can automatically enter a low power mode. When the earbud is worn, it can quickly wake up from "sleep" and quickly respond to user operation. Therefore, the wearing detection function can not only simplify the user operation and improve the user experience, but also is an important energy-saving measure, and especially can significantly improve the endurance for a battery-powered wireless earbud.

Common wearing detection generally adopts an optical scheme, a capacitance detection scheme or an infrared sensor scheme, where the optical scheme and the infrared sensor scheme have the problems of complicated structure design and high cost; and the capacitance detection scheme has the advantages of simple structure, no need for opening holes and low cost. However, these schemes are prone to false touch. When the earbud is placed on a table or held by hand, the earbud is easily misjudged to be worn.

SUMMARY

Aiming at the problem of misjudgment on wearing detection due to false touch in the prior art, embodiments of the present application provide an earbud and a method for implementing a wearing detection and a touch operation.

A first aspect of the embodiments of the present application provides an earbud, including: at least two wearing sensors; where each of the at least two wearing sensors comprises one or more capacitive sensing units, and a maximum detected capacitance value or a sum of detected capacitance values of the capacitive sensing units of each of the at least two wearing sensors is used as a maximum detection value of the wearing sensor; and the at least two wearing sensors are arranged at different positions where a head of the earbud is in direct contact with skin tissues in the ear, and the earbud is determined to be in a worn state when the maximum detection value of each of the at least two wearing sensors is not smaller than a wearing threshold.

Further, in combination with the first aspect, in an implementation manner of the first aspect, the at least two wearing sensors include at least one first wearing sensor, each of the at least one first wearing sensor including at least two capacitive sensing units; and in the worn state, when the capacitance value detected on any of capacitive sensing units of any of the at least one first wearing sensor is smaller than a correct wearing threshold, the earbud is determined to be not correctly worn.

Further, in combination with the first aspect and the above implementation manner, in another implementation manner of the first aspect, all the capacitive sensing units of the at least two wearing sensors are arranged on the inner surface of an earbud housing or inside the housing.

Further, in combination with the first aspect and the above implementation manners, in another implementation manner of the first aspect, the earbud further includes a touch sensor and a detection processing circuit; the touch sensor is arranged on the head or a stem of the earbud away from the ear, and is configured to detect a touch operation when the earbud is in the worn state; and the at least two wearing sensors and the touch sensor are connected with the detection processing circuit, and share the detection processing circuit.

Further, in combination with the first aspect and the above implementation manners, in another implementation manner of the first aspect, the detection processing circuit includes a driver; the touch sensor includes capacitive sensing units; and the driver is connected with all the capacitive sensing units of the at least two wearing sensors and the touch sensor, and is configured to drive all the capacitive sensing units of the at least two wearing sensors and the touch sensor.

Further, in combination with the first aspect and the above implementation manners, in another implementation manner of the first aspect, the detection processing circuit includes a multiplexer; and the multiplexer is connected with the at least two wearing sensors and the touch sensor, and is configured to select capacitance signals acquired by all the capacitive sensing units of the at least two wearing sensors and the touch sensor.

Further, in combination with the first aspect and the above implementation manners, in another implementation manner of the first aspect, all the capacitive sensing units of the touch sensor are arranged on the inner surface of the earbud housing or inside the housing.

Further, in combination with the first aspect and the above implementation manners, in another implementation manner of the first aspect, the detection processing circuit includes a main control chip; and the main control chip is configured to update the current wearing state with a preset frequency.

A second aspect of the embodiments of the present application provides a method for implementing a wearing detection and a touch operation for the earbud, including: acquiring capacitance values of the at least two wearing sensors; judging whether the maximum detection value of each of the at least two wearing sensor is not smaller than a wearing threshold; and if yes, judging that the earbud is in a worn state, and setting the touch sensor to be in a working state.

Further, in combination with the second aspect, in an implementation manner of the second aspect, the method further includes: judging, when the earbud is in the worn state, whether any capacitance value detected on all capacitive sensing units of any of the at least one first wearing sensor is smaller than a correct wearing threshold; and if yes, judging that the earbud is not correctly worn, and setting a prompt for adjusting the wearing position.

Further, in combination with the second aspect and the above implementation manner, in another implementation manner of the second aspect, the method further includes: updating the current wearing state of the earbud with a preset frequency.

Further, in combination with the second aspect and the above implementation manners, in another implementation manner of the second aspect, the method further includes: executing an operation of step increase when the amount of jitter of the maximum detection value of the wearing sensor is not smaller than a step jitter threshold.

Compared with the prior art, the embodiments of the present application have the advantageous effects: the embodiments of the present application provide an earbud and a method for implementing a wearing detection and a touch operation, which solve the problem of misjudgment on wearing detection due to false touch, can prevent the earbud placed on a table or held by hand from being misjudged to be worn, and remarkably improve the accuracy of wearing detection.

BRIEF DESCRIPTION OF THE DRAWINGS

To describe the technical solutions in the embodiments of the present application or in the prior art more clearly, the following briefly introduces the accompanying drawings required for describing the embodiments or the prior art. Apparently, the accompanying drawings in the following description show some embodiments of the present application, and persons skilled in the art may still derive other drawings from these accompanying drawings without creative efforts.

DETAILED DESCRIPTION

To make the objectives, technical solutions, and advantages of the present application clearer, the following elaborates part of embodiments of the present application by example with reference to the accompanying drawings. However, it should be understood by persons of ordinary skill in the art that, in the examples, numerous technical details are set forth in order to provide a reader with a better understanding of the present application. However, the technical solutions of the present application may also be implemented without these technical details and various variations and modifications based on the following embodiments.

Figure 1:
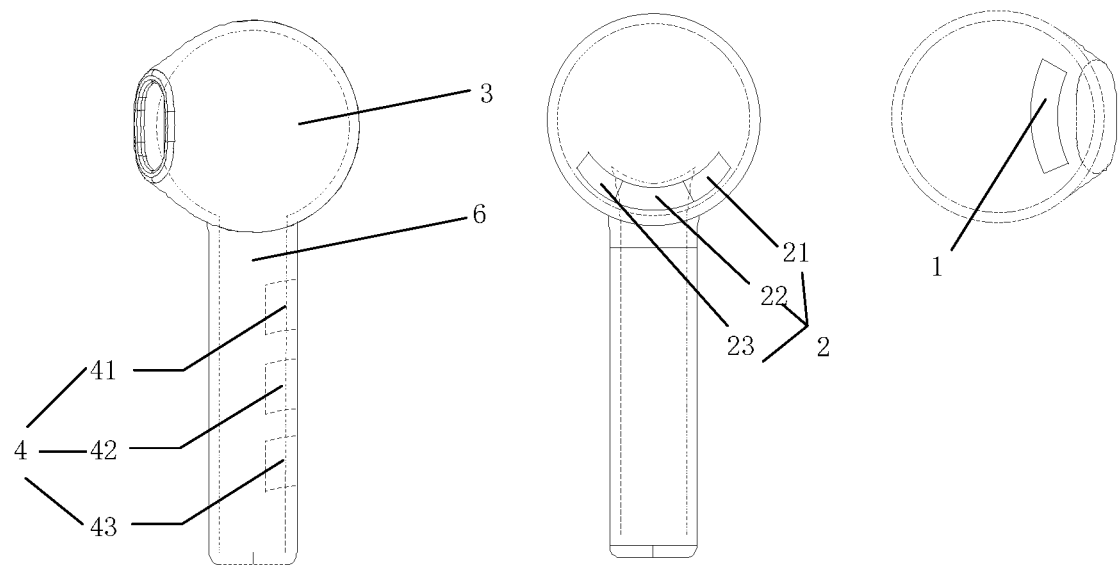
FIG. 1 is a first structural diagram of an earbud according to an embodiment of the present application.

Refer to FIG. 1, which is a first structural diagram of an earbud according to an embodiment of the present application. This embodiment is described based on the earbud model in FIG. 1, but a person skilled in the art should understand that the earbud model is only exemplary, and in actual use, the person skilled in the art may select other models to implement this solution by referring to the solution of the embodiment of the present application. In FIG. 1, the earbud includes a head 3 and a stem 6, but it should be apparent to persons skilled in the art that in actual use, they may also select an earbud without a stem to implement this solution. In addition, this embodiment is exemplified by one earbud, but it should be understood by a person skilled in the art that one earbud is only an exemplary description, and in actual use, the person skilled in the art may select a pair of earbuds to implement this solution with reference to the solution of the embodiment of the present application. It should be noted that the wearing detections or touch operations of multiple earbuds may be or may not be independent of each other, which is not limited in this embodiment. In addition, this embodiment is exemplified by a cable-free true wireless earbud, but it should be understood by a person skilled in the art that the cable-free true wireless earbud is only an exemplary description, and in actual use, the person skilled in the art may select other types of earbuds to implement this solution with reference to the solution of the embodiment of the present application, including, but not limited to, wired earbuds and wireless earbuds having a cable between two earbuds.

The earbud includes at least two wearing sensors. As shown in FIG. 1, in this embodiment, the earbud is exemplified by an earbud including two wearing sensors, but it should be understood by a person skilled in the art that the earbud including two wearing sensors is only an exemplary description, and in actual use, the person skilled in the art may select an earbud including more than two wearing sensors to implement this solution with reference to the solution of the embodiment of the present application. Each wearing sensor includes at least one capacitive sensing unit. In FIG. 1, the wearing sensor 1 includes a capacitive sensing unit, and the wearing sensor 2 includes three capacitive sensing units, respectively a capacitive sensing unit 21, a capacitive sensing unit 22, and a capacitive sensing unit 23. The wearing sensors in this embodiment respectively include one and three capacitive sensing units. It should be understood by a person skilled in the art that the wearing sensors respectively including one and three capacitive sensing units is only an exemplary description, and in actual use, the person skilled in the art may select the wearing sensors including any number of capacitive sensing units to implement this solution with reference to the solution of the embodiment of the present application. The capacitive sensing unit 21, the capacitive sensing unit 22, and the capacitive sensing unit 23 of the wearing sensor 2 in the embodiment of the present application are adjacent. This embodiment is exemplified by the wearing sensor including three adjacent capacitive sensing units, but it should be understood by a person skilled in the art that the situation of adjacent capacitive sensing units of the wearing sensor is only an exemplary description, and in actual use, the person skilled in the art may select the wearing sensor including capacitive sensing units that are not adjacent to implement this solution with reference to the solution of the embodiment of the present application.

In the embodiment of the present application, as shown in FIG. 1, the capacitive sensing unit 21, the capacitive sensing unit 22, and the capacitive sensing unit 23 of the wearing sensor 1 are all quadrangular, but it should be understood by a person skilled in the art that the capacitive sensing units may be in various shapes. In actual use, the person skilled in the art may select the capacitive sensing units of different shapes and sizes to implement this solution, e.g., regular shapes such as triangles and pentagons and other irregular shapes, with reference to the solution of the embodiment of the present application.

In the embodiment of the present application, the two wearing sensors are arranged at different positions where the head of the earbud is in direct contact with skin tissues in the ear. As shown in FIG. 1, the wearing sensor 1 is arranged near a bell mouth, and the wearing sensor 2 is arranged at the bottom of the head of the earbud. The wearing sensors in this embodiment are respectively arranged near the bell mouth and at the bottom of the head of the earbud. It should be understood by a person skilled in the art that the wearing sensors arranged near the bell mouth and at the bottom of the head of the earbud is only an exemplary description, and in actual use, the person skilled in the art may set the wearing sensors at other different positions to implement this solution by referring to the solution of the embodiment of the present application. When the user wears the earbud, if the skin tissues of the ear are in contact with the wearing sensors, the capacitance values on the capacitive sensing units of the wearing sensors change, so that the function of wearing detection can be realized based on the capacitance values on the wearing sensors. On the one hand, when the earbud is held by hand, if the hand is in contact with the wearing sensors, the capacitance values change. On the other hand, when the table is in contact with the wearing sensors, the capacitance values on the capacitive sensing units also change. Accordingly, if the capacitance value detected on only one wearing sensor is used as the basis of wearing detection, the earbud is easily misjudged to be in a worn state due to false touch. In the embodiment of the present application, the capacitance values detected from all the wearing sensors are used as the basis for detecting that the earbud is in the worn state, and because the wearing sensor 1 and the wearing sensor 2 are at different positions, the wearing sensor 1 and the wearing sensor 2 are generally not touched at the same time, and therefore misjudgment caused by false touch on the earbud can be greatly reduced, and the accuracy of wearing detection is significantly improved.

In the embodiment of the present application, a maximum capacitance value or a sum of capacitance values detected on the capacitive sensing units of any wearing sensor is used as the maximum detection value of each wearing sensor, and when the maximum detection values of all the wearing sensors are not smaller than wearing thresholds, the earbud is determined to be worn. It should be noted that the wearing thresholds may be the same or different for different wearing sensors. In addition, it should be noted that the sum of capacitance values detected on the capacitive sensing units of any wearing sensor may be the sum of capacitance values detected on part of or all of the capacitive sensing units of any wearing sensor, which is not limited herein.

Optionally, in an embodiment, as shown in FIG. 1, the capacitance value detected on the capacitive sensing unit of the wearing sensor 1 is used as the maximum detection value of the wearing sensor 1, and the sum of the detected capacitance values or the maximum capacitance value of the three capacitive sensing units of the wearing sensor 2 may be used as the maximum detection value of the wearing sensor 2. When the maximum detection values of the wearing sensors 1 and 2 are respectively not smaller than the wearing thresholds of the wearing sensors 1 and 2, the earbud is determined to be worn. It should be noted that the same wearing threshold or different wearing thresholds may be set for the wearing sensors 1 and 2, which is not limited in the embodiment of the present application.

The wearing position of the earbud directly affects the user experience, and the incorrect wearing position not only causes the problem of easy falling off, but also affects the audio experience more easily. In order to guide the user to wear correctly, whether the user's wearing position is correct needs to be detected. The wearing sensors include at least one first wearing sensor, the first wearing sensor including at least two capacitive sensing units; and when the capacitance value detected on any capacitive sensing unit of any first wearing sensor is smaller than a correct wearing threshold, the earbud is determined to be not correctly worn. It should be noted that whether the earbud is correctly worn is detected only in the worn state. In the embodiment of the present application, the wearing sensor including three capacitive sensing units is selected as the first wearing sensor for detecting whether the earbud is correctly worn. Specifically, when the capacitance values detected on all the capacitive sensing units of all the first wearing sensors are greater than or equal to the correct wearing thresholds, the earbud is determined to be correctly worn. As shown in FIG. 1, the wearing sensor 2 includes three capacitive sensing units, respectively a capacitive sensing unit 21, a capacitive sensing unit 22, and a capacitive sensing unit 23, so the wearing sensor 2 may be used as the first wearing sensor. The first wearing sensor in this embodiment includes three capacitive sensing units. It should be understood by a person skilled in the art that the first wearing sensor including three capacitive sensing units is only an exemplary description, and the first wearing sensor may include two or more capacitive sensing units. In the embodiment of the present application, when the earbud is worn, if any capacitance value detected on the capacitive sensing unit 21, the capacitive sensing unit 22, and the capacitive sensing unit 23 is smaller than the correct wearing thresholds corresponding to the capacitive sensing unit 21, the capacitive sensing unit 22, and the capacitive sensing unit 23, the earbud is determined to be not correctly worn. It should be noted that, when the earbud is in the worn state, the capacitive sensing units at different positions contact differently, and therefore the capacitance values of the capacitive sensing units are also different, so the correct wearing thresholds corresponding to the capacitive sensing unit 21, the capacitive sensing unit 22 and the capacitive sensing units 23 may be the same or different, which is not limited in this embodiment. There is only one first wearing sensor in this embodiment, but it should be understood by a person skilled in the art that the earbud including a first wearing sensor is only an exemplary description, and the earbud may further include a plurality of first wearing sensors. In this embodiment, in the presence of only one first wearing sensor, it only needs to determine whether the first wearing sensor satisfies the condition of correct wearing in the worn state. In the presence of multiple first wearing sensors, it needs to determine whether each first wearing sensor satisfies the condition of correct wearing, and if all satisfy, the earbud is correctly worn.

Figure 2:
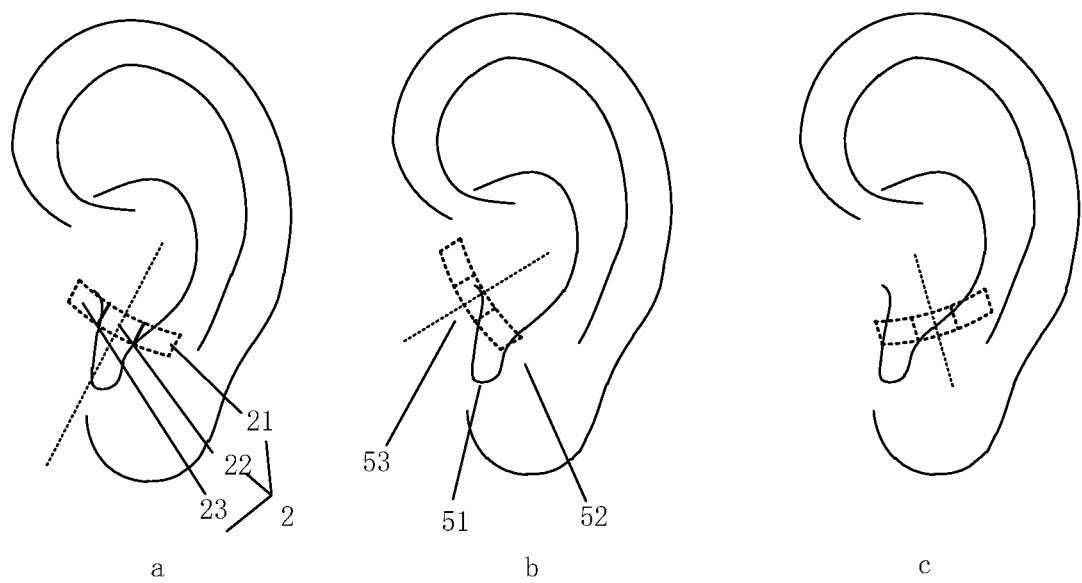
FIG. 2 is a schematic diagram of capacitive sensing units of a wearing sensor 2 of the earbud at three wearing positions according to an embodiment of the present application.

In this embodiment, three wearing cases of the earbud are represented by three different positions of the wearing sensor 2. As shown in FIG. 2, the wearing sensor 2 includes three capacitive sensing units 21, 22 and 23. FIG. 2(a) describes the position of the wearing sensor 2 when the earbud is correctly worn, and at this wearing position, the earbud is unlikely to fall off and the user's tone experience is good. According to FIG. 2(a), the capacitive sensing unit 21 is in contact with an antitragus 52, and the capacitive sensing unit 23 is in contact with a tragus 53, and the capacitive sensing unit 22 is above an inter-tragus incisura 51 and is substantially not in contact with the ear. Because the capacitance values become large when the capacitive sensing units are in contact with the ear, the capacitance values of the capacitive sensing units 23 and 21 are larger, and the capacitance value of the capacitive sensing unit 22 is smaller. As shown in FIG. 2(b), the capacitive sensing units 23 and 22 are in contact with the tragus 53, and the capacitive sensing unit 21 is above the inter-tragus incisura 51 and is substantially not in contact with the ear, and under the present circumstances, the capacitance values of the capacitive sensing units 23 and 22 are larger, and the capacitance value of the capacitive sensing unit 21 is smaller. As shown in FIG. 2(c), the capacitive sensing units 22 and 21 are in contact with the antitragus 52, and the capacitive sensing unit 23 is above the inter-tragus incisura 51 and is substantially not in contact with the ear, and under the present circumstances, the capacitance values of the capacitive sensing units 22 and 21 are larger, and the capacitance value of the capacitive sensing unit 23 is smaller. Corresponding correct wearing thresholds may be set for the three capacitive sensing units of the wearing sensor 2 to determine whether the earbud is at the correct wearing position. In this embodiment, large correct wearing thresholds may be set for the capacitive sensing units 23 and 21, and a small correct wearing threshold may be set for the capacitive sensing unit 22. It should be noted that the solution of setting the correct wearing thresholds in this embodiment is only an exemplary description, and persons skilled in the art may set correct wearing thresholds for the capacitive sensing units of the wearing sensor by using different solutions based on different usage requirements.

Preferably, when the earbud is not correctly worn, the user may also be prompted to adjust the wearing position. For example, in the case of FIG. 2(a), the capacitance values of the capacitive sensing units 23 and 21 are larger, and the capacitance value of the capacitive sensing unit 22 is smaller, which belongs to a correct wearing state, so prompt may not be set; in the case of FIG. 2(b), the capacitance values of the capacitive sensing units 23 and 22 are larger, the capacitance value of the capacitive sensing unit 21 is smaller, and then the user may be prompted to rotate the earbud counterclockwise, so as to increase the capacitance value of the capacitive sensing unit 21 and reduce the capacitance value of the capacitive sensing unit 22 to the correct wearing state; in the case of FIG. 2(c), the capacitance values of the capacitive sensing units 22 and 21 are larger, the capacitance value of the capacitive sensing unit 23 is smaller, and the user may be prompted to rotate the earbud clockwise, so as to increase the capacitance value of the capacitive sensing unit 23 and reduce the capacitance value of the capacitive sensing unit 22 to the correct wearing state. In addition, the user may also be prompted to adjust the angle of clockwise or counterclockwise rotation when the wearing position is adjusted based on differences between the detected capacitance values and the correct wearing thresholds.

Optionally, the capacitive sensing units of the wearing sensors may be directly arranged on the inner surface of an earbud housing, or arranged inside the earbud housing by an injection molding process or other process.

Figure 3:
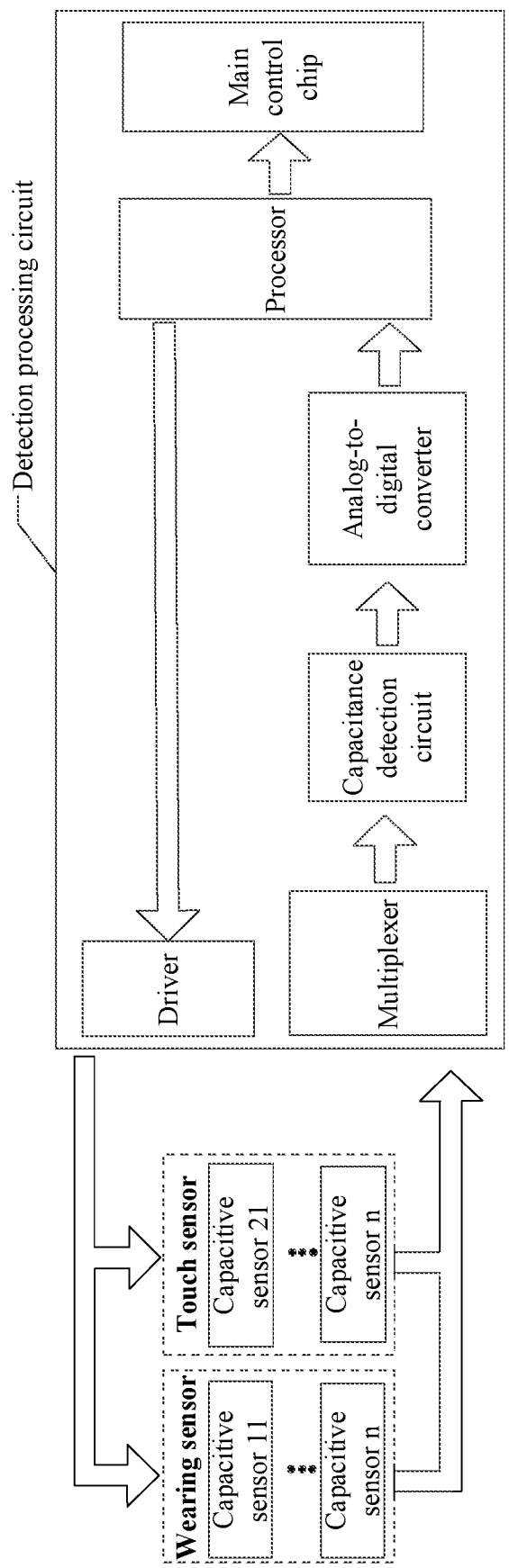
FIG. 3 is a second structural diagram of an earbud according to an embodiment of the present application.

FIG. 3 is a second structural diagram of the earbud according to an embodiment of the present application. Optionally, the earbud further includes a touch sensor and a detection processing circuit, where the detection processing circuit of the earbud is configured to detect and process the capacitance values of the wearing sensor and the touch sensor, the wearing sensor and the touch sensor is connected with the detection processing circuit, and the wearing sensor and the touch sensor share the detection processing circuit, so that touch and wearing detections may be simultaneously implemented without an additional hardware circuit, and the cost can be greatly reduced, and the difficulty in integration is reduced. The touch sensor is arranged at on the head or stem of the earbud away from the ear, and is configured to detect a touch operation when the earbud is worn. The triggering method for the touch sensor includes, but is not limited to, touch or slide during touch.

Optionally, the detection processing circuit includes a driver; as shown in FIG. 3, the touch sensor includes capacitive sensing units; the touch sensor and the wearing sensors, which both include capacitive sensing units, may share a driving circuit; and the driver is connected with all the capacitive sensing units of the wearing sensors and the touch sensor, and is configured to drive all the capacitive sensing units of the wearing sensors and the touch sensor.

Optionally, the detection processing circuit includes a multiplexer; and the multiplexer is connected with the wearing sensors and the touch sensor, and is configured to select capacitance signals acquired by all the capacitive sensing units of the wearing sensors and the touch sensor. As shown in FIG. 3, the detection processing circuit further includes a capacitance detection circuit, an analog-to-digital converter, and a processor. In the absence of the multiplexer, each capacitive sensing unit may also correspond to a set of capacitance detection circuit and analog-to-digital converter, but this increases the cost and is unfavorable for integration.

Figure 4:
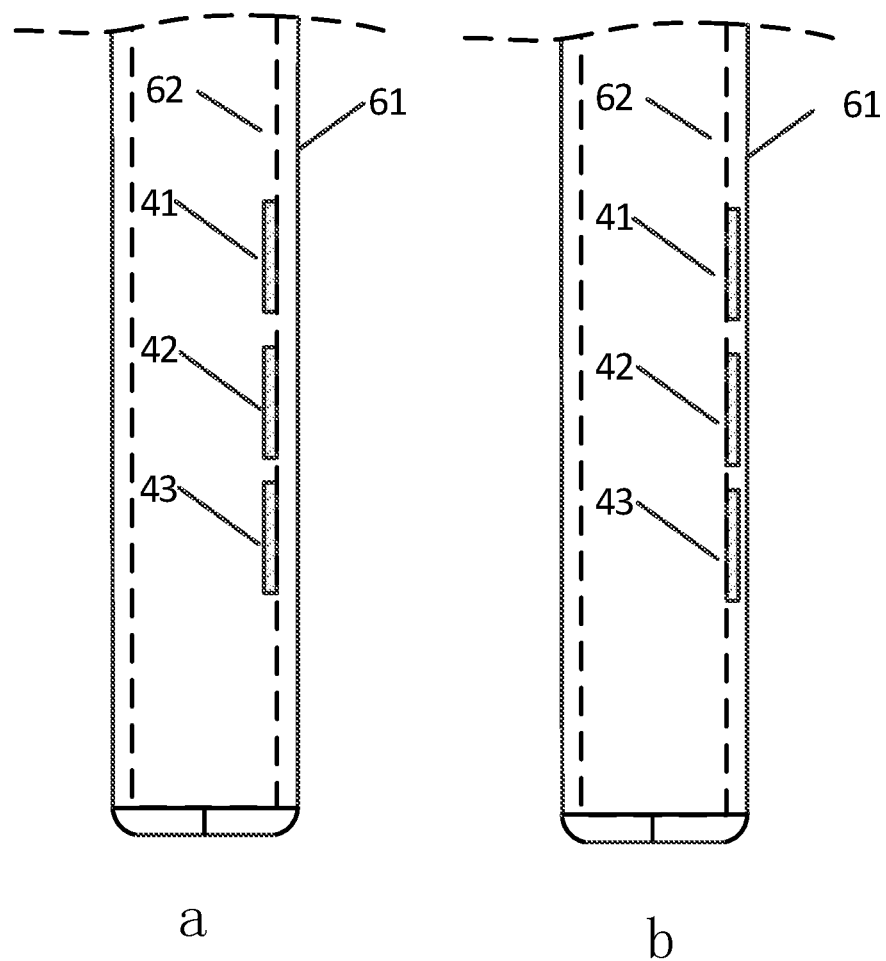
FIG. 4 is a schematic diagram of capacitive sensing units of a touch sensor according to an embodiment of the present application.

Optionally, all the capacitive sensing units of the touch sensor are arranged on the inner surface of the earbud housing or inside the housing. Like the wearing sensor, the capacitive sensing units of the touch sensor may be directly arranged on the inner surface of the earbud housing, or arranged inside the earbud housing by an injection molding process or other process, as shown in FIG. 4. In FIG. 4(a), the capacitive sensing units 41, 42 and 43 of the touch sensor 4 may be directly arranged on the inner surface 62 of the housing of the earbud stem. In FIG. 4(b), the capacitive sensing units of the touch sensor are arranged inside the housing of the earbud stem, that is, between the inner surface 62 and outer surface 61 of the housing of the earbud stem. In addition, this embodiment is exemplified by quadrangular capacitive sensing units, but the shape and size of the capacitive sensing units of the touch sensor are not limited. Moreover, this embodiment is exemplified by the capacitive sensing units at the earbud stem, but the positions of the capacitive sensing units are not limited, and the capacitive sensing units of the touch sensor may also be arranged at the head of the earbud.

Optionally, the detection processing circuit includes a main control chip. When the state is worn and unworn, the main control chip may update the current wearing state with preset frequencies, so that wearing action of the user may be monitored at any time. The preset frequencies for updating the current wearing state in the worn and unworn states may be different.

The embodiment of the present disclosure provides an earbud, which solves the problem of misjudgment on wearing detection due to false touch, can prevent the earbud placed on a table or held by hand from being misjudged to be worn, and remarkably improves the accuracy of wearing detection.

Figure 5:
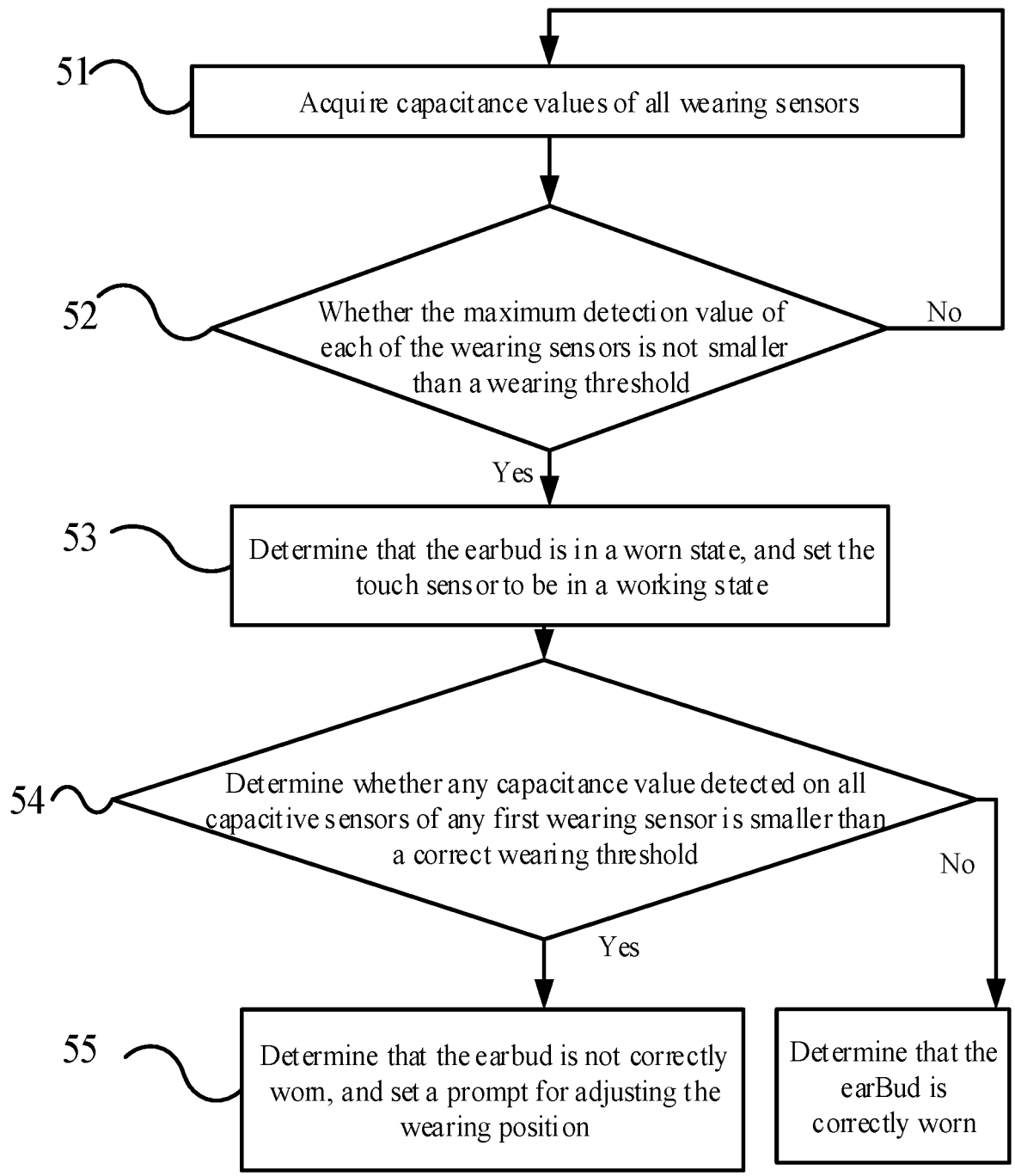
FIG. 5 is a flowchart of a method for implementing a wearing detection and a touch operation according to an embodiment of the present application.

This embodiment further provides a method for implementing a wearing detection and a touch operation. The method is applied to the earbud. As shown in FIG. 5, the method includes:

Step 51: capacitance values of all wearing sensors are acquired;

Step 52: whether the maximum detection value of each wearing sensor is not smaller than a wearing threshold is determined;

Step 53: if yes, the earbud is determined to be in a worn state, and the touch sensor is set to be in a working state.

Whether the earbud is worn is determined based on the values of capacitive sensing units of a plurality of wearing sensors at different positions, which can greatly reduce misjudgment problems caused by false touch and improve the accuracy of wearing detection. When the wearing state is the worn state, the touch sensor is set to be in a working state. Only when the earbud is in the worn state, the earbud responds to user's touch operation. When the earbud is taken off, it can automatically enter a low power mode, without responding to user's touch operation. When the earbud is worn, it can quickly wake up from "sleep" and quickly respond to a user operation, which can achieve the purpose of saving energy, and especially can significantly improve the endurance for a battery-powered wireless earbud.

Optionally, if the earbud is worn, the following steps may be executed:

Step 54: whether any capacitance value detected on all capacitive sensing units of any first wearing sensor is smaller than a correct wearing threshold is determined;

Step 55: if yes, the earbud is determined to be not correctly worn, and a prompt for adjusting the wearing position is set.

In order to guide the user to wear correctly, whether the user's wearing position is correct needs to be detected. It should be noted that whether the earbud is correctly worn is detected only in the worn state. When the earbud is in the worn state, the capacitive sensing units at different positions contact with the skin differently, and therefore the capacitance values of the capacitive sensing units are also different, so whether the earbud is correctly worn may be determined based on the capacitance values of the capacitive sensing units, where when the capacitance value on each capacitive sensing unit of the first wearing sensor is not smaller than the correct wearing threshold corresponding to the capacitive sensing unit, the first wearing sensor is at the corresponding position when the earbud is correctly worn, and the earbud can be determined to be correctly worn when all the first wearing sensors satisfy the condition; and when the earbud is not correctly worn, a prompt for adjusting the wearing position of the earbud may be set based on the capacitance values of the capacitive sensing units of the first wearing sensor, and the user may adjust the wearing position of the earbud based on the prompt. How to set the prompt for adjusting the wearing position of the earbud based on the capacitance values of the capacitive sensing units has been exemplified in the foregoing, and details are not described herein again.

In addition, the current wearing state of the earbud also needs to be updated with a preset frequency, so that the user's operation of taking off or wearing the earbud can be detected and responded in time. It should be noted that, in the worn state, the current wearing state of the earbud needs to be updated with a preset frequency, and in the unworn state, the current wearing state of the earbud may also be updated with a preset frequency, where the preset frequencies in the two cases may be different or the same, which is not limited in this embodiment.

Optionally, the function of step counting detection may be realized by using the wearing sensor. During movement, the contact between the capacitive sensing units of the wearing sensor and the skin may change, so the maximum detection value of the wearing sensor may jitter. When the amount of jitter is not smaller than a step jitter threshold, an operation of step increase is performed to update the current step data.

It should be noted that, when the amount of jitter is not smaller than the step jitter threshold, the number of steps may be increased by 1 or 2. How many steps are increased may be determined based on the magnitude of jitter, which is not limited in this embodiment.

The embodiment of the present application provides a method for implementing a wearing detection and a touch operation. The method is applied to the earbud, solves the problem of misjudgment on wearing detection due to false touch, can prevent the earbud placed on a table or held by hand from being misjudged to be worn, and remarkably improves the accuracy of wearing detection.

It should be noted that the above method embodiment of the present application may be applied to a processor or implemented by a processor. The processor may be an integrated circuit chip with signal processing capability. In the implementation process, each step of the method embodiment may be completed by an integrated logic circuit of hardware in the processor or by an instruction in the form of software. The processor may be a general-purpose processor, a digital signal processor (DSP), an application specific integrated circuit (ASIC), a field programmable gate array (FPGA) or other programmable logic device, discrete gate or transistor logic device, or discrete hardware component. The processor may implement or execute the methods, steps, and logical block diagrams disclosed in the embodiments of the present application. The general-purpose processor may be a microprocessor or any conventional processor, etc. The steps of the methods disclosed in the embodiments of the present application may be directly implemented by a hardware decoding processor, or by a combination of hardware and software modules in the decoding processor. The software modules may be located in a storage medium mature in the art, such as a random access memory, a flash memory, a read-only memory, a programmable read-only memory, an electrically erasable programmable memory, or a register. The storage medium is located in a memory, and the processor reads the information in the memory and combines the hardware to complete the steps of the above method.

It should be understood that the memory in the embodiments of the present application may be a volatile memory or a non-volatile memory, or include both volatile and non-volatile memories. The non-volatile memory may be a read-only memory (ROM), a programmable ROM (PROM), an erasable PROM (EPROM), an electrically EPROM (EEPROM) or a flash memory.

The volatile memory may be a random access memory (RAM) serving as an external cache. By exemplary but not restrictive description, many forms of RAM are available, such as a static RAM (SRAM), a dynamic RAM (DRAM), a synchronous DRAM (SDRAM), a double data rate SDRAM (DDR SDRAM), an enhanced SDRAM (ESDRAM), a synchlink DRAM (SLDRAM), and a direct rambus RAM (DR RAM). It should be noted that the memories of the systems and methods described herein are intended to include, but not limited to, these and any other suitable types of memories.

It should be understood that, in the embodiments of the present application, "B corresponding to A" indicates that B is associated with A, and B may be determined from A. However, it should also be understood that, the determination of B from A does not indicate that B is only determined from A, but may also be determined from A and/or other information.

In addition, the term "and/or" is merely an association relationship describing associated objects, indicating three relationships, for example, A and/or B may indicate that A exists alone, A and B exist at the same time, and B exists alone. In addition, the character "/" generally indicates that the associated objects are in an "or" relationship.

Persons of ordinary skill in the art may realize that the units and algorithmic steps of each example described in combination with the embodiments disclosed herein may be implemented by electronic hardware, or a combination of computer software and electronic hardware. Whether these functions are executed by hardware or software depends on a specific application and design constraint conditions of the technical solution. Professionals may implement the described functions for each specific application by using different methods, but such implementation should not be considered beyond the scope of the present application.

Persons skilled in the art may clearly understand that, for the sake of convenience and briefness in description, for the specific working processes of the above-described systems, apparatuses and units, reference may be made to the corresponding processes in the embodiments of the aforementioned methods, and details are not described herein again.

In the several embodiments provided in the application, it shall be understood that the disclosed systems, devices and methods may be realized in other modes. For example, the above-described device embodiment is only exemplary, for example, the division of the units is only a logic function division, other division modes may be adopted in practice, e.g., a plurality of units or components may be combined or integrated in another system, or some characteristics may be omitted or are not executed. In addition, the displayed or discussed mutual couplings or direct couplings or communication connections may be implemented by some interfaces. The indirect couplings or communication connections between devices or units may be implemented in electronic, mechanical, or other forms.

The units illustrated as separate components may be or may not be physically separated, and the components displayed as units may be or may not be physical units, that is to say, the components may be positioned at one place or may also be distributed on a plurality of network units. The objectives of the solutions of the embodiments may be fulfilled by selecting part of or all of the units according to actual needs.

In addition, the functional units in the embodiments of the present application may be integrated into one processing unit, or each of the units may exist alone physically, or two or more units may be integrated into one unit.

When the functions are realized in the form of software functional units and sold or used as independent products, the functions may be stored in computer readable storage mediums. Based on such an understanding, the technical solution of the present application substantially, or the part of the present disclosure making contribution to the prior art, or a part of the technical solution may be embodied in the form of a software product, and the computer software product is stored in a storage medium, which includes a plurality of instructions enabling a computer device (which may be a personal computer, a server, or a network device, etc.) to execute all of or part of the steps in the methods of the embodiments of the present application. The aforementioned storage medium includes: various media capable of storing program codes, such as a U disk, a mobile hard disk, a read-only memory (ROM), a random access memory (RAM), a magnetic disk or an optical disk.

Described above are merely specific embodiments of the present application, but the scope of the present application is not limited to this, any skilled who is familiar with this art could readily think of variations or substitutions within the disclosed technical scope of the present application, and these variations or substitutions shall fall within the scope of the present application. Thus, the scope of the present application shall be subjected to the scope of the claims.

What is claimed is:

1. An earbud, comprising:
at least two wearing sensors, wherein the at least two wearing sensors are arranged at different positions at which a head of the earbud is in contact with skin tissues in an ear of a user, and the earbud is determined to be whether in a worn state according to capacitance values detected by the at least two wearing sensors when a maximum detection value of each of the at least two wearing sensors is not smaller than a wearing threshold, wherein the wearing threshold is different for different wearing sensors, and each of the at least two wearing sensors comprises one or more capacitive sensing units, and
the earbud is determined to be whether in a worn state according to capacitance values detected by the at least two wearing sensors further comprises:
the earbud is determined to be in the worn state when a maximum detected capacitance value or a sum of detected capacitance values of the capacitive sensing units of each of the at least two wearing sensors is not smaller than a wearing threshold.

2. The earbud according to claim 1, wherein all the capacitive sensing units of the at least two wearing sensors are arranged on the inner surface of an earbud housing or inside the earbud housing.

3. The earbud according to claim 1, wherein the head of the earbud comprises a bell mouth and a bottom, and two wearing sensors of the at least two wearing sensors are respectively arranged near the bell mouth and at the bottom of the head of the earbud.

4. The earbud according to claim 1, wherein the head of the earbud comprises two surfaces who have different distances to a head of the user when the earbud is in the worn state, and two wearing sensors of the at least two wearing sensors are respectively arranged at different surfaces of the two surfaces.

5. The earbud according to claim 1, further comprising a touch sensor and a detection processing circuit; wherein
the touch sensor is arranged on the head or a stem of the earbud away from the ear, and is configured to detect a touch operation when the earbud is in the worn state; and
the at least two wearing sensors and the touch sensor are connected with the detection processing circuit, and share the detection processing circuit.

6. The earbud according to claim 5, wherein the detection processing circuit comprises a driver;
the touch sensor comprises capacitive sensing units; and
the driver is connected with all the capacitive sensing units of the at least two wearing sensors and the touch sensor, and is configured to drive all the capacitive sensing units of the at least two wearing sensors and the touch sensor.

7. The earbud according to claim 6, wherein the detection processing circuit comprises a multiplexer; and
the multiplexer is connected with the at least two wearing sensors and the touch sensor, and is configured to select capacitance signals acquired by all the capacitive sensing units of the at least two wearing sensors and the touch sensor.

8. The earbud according to claim 5, wherein the detection processing circuit comprises a main control chip; and
the main control chip is configured to update a current wearing state with a preset frequency.

9. The earbud according to claim 6, wherein all the capacitive sensing units of the touch sensor are arranged on an inner surface of an earbud housing or inside the earbud housing.

10. A method for implementing a wearing detection and a touch operation, applied to the earbud according to claim 1, comprising:
acquiring capacitance values of the at least two wearing sensors;
determining whether the maximum detected capacitance value or the sum of detected capacitance values of the capacitive sensing units of each of the at least two wearing sensors is not smaller than a wearing threshold; and
if yes, determining that the earbud is in a worn state, and setting a touch sensor of the earbud to be in a working state,
wherein the method further comprising:
determining, when the earbud is in the worn state, whether any capacitance value detected by all capacitive sensing units of any of the at least one first wearing sensor is smaller than a correct wearing threshold; and
if yes, determining that the earbud is not correctly worn, and setting a prompt for adjusting the wearing position.

11. The method according to claim 10, wherein the setting a prompt for adjusting the wearing position comprise:
setting the prompt of adjusting an angle of a clockwise or counterclockwise rotation based on differences between the capacitance values detected and the correct wearing thresholds.

12. The method according to claim 10, further comprising:
updating a current wearing state of the earbud with a preset frequency.

13. The method according to claim 10, further comprising:
executing an operation of counting up steps taken by the user when an amount of jitter of the maximum detection value of the wearing sensor is not smaller than a step jitter threshold.

14. An earbud, comprising:
at least two wearing sensors, wherein the at least two wearing sensors are arranged at different positions at which a head of the earbud is in contact with skin tissues in an ear of a user, and the earbud is determined to be whether in a worn state according to capacitance values detected by the at least two wearing sensors when a maximum detection value of each of the at least two wearing sensors is not smaller than a wearing threshold,
wherein the at least two wearing sensors comprise at least one first wearing sensor, each of the at least one first wearing sensor comprising at least two capacitive sensing units; and
in the worn state, when the capacitance value detected by any of the capacitive sensing units of any of the at least one first wearing sensor is smaller than a correct wearing threshold, the earbud is determined to be not correctly worn.

15. The earbud according to claim 14, wherein the first wearing sensor comprises three capacitive sensing units, and two capacitive sensing units of the three capacitive sensing units are in contact with tragi and the other capacitive sensing unit of the three capacitive sensing units is between the two capacitive sensing units and is above an inter-tragus incisura when the earbud is correctly worn.

16. The earbud according to claim 15, the three capacitive sensing units are adjacent.

17. The earbud according to claim 14, wherein the first wearing sensor is arranged at a bottom of a surface of the head of the earbud whose distance to a head of the user is farther than that of the other surface of the head of the earbud.

* * * * *